(12) United States Patent
Davidson et al.

(10) Patent No.: US 6,392,156 B1
(45) Date of Patent: May 21, 2002

(54) HIGH CURRENT CONDUCTORS AND HIGH FIELD MAGNETS USING ANISOTROPIC SUPERCONDUCTORS

(75) Inventors: Arthur Davidson, Yorktown Heights; Timothy Rea Dinger, Chappaqua; William Joseph Gallagher, Ardsley; Thomas Kimber Worthington, New York, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 08/396,288

(22) Filed: Feb. 28, 1995

Related U.S. Application Data

(63) Continuation of application No. 08/193,925, filed on Feb. 9, 1994, which is a continuation of application No. 07/569,501, filed on Aug. 20, 1990, which is a continuation of application No. 07/051,552, filed on May 18, 1987.

(51) Int. Cl.$^7$ ............................................... H01B 12/00

(52) U.S. Cl. ..................................... 174/125.1; 335/216

(58) Field of Search ...................... 174/125.1; 335/216; 505/100, 230, 231, 775, 884, 887, 813, 729, 741, 833, 812, 727

(56) References Cited

PUBLICATIONS

Hall Effect in Superconducting ($La_1$–$xSr_x$) Cu O4 Single Crystal Thin Films, Japanese Journal of Applied Physics, vol. 26, No. 4, Apr. 1987.*

ASAHI Newspaper, Mar. 10, 1987.*

Extended Abstracts, High Temperature Superconductors, "Fabrication of 91k Superconducting Coils", Apr. 23–24, 1987.*

Preparation and Property of $La_{1.85}Sr_{0.15}CuO_4$ Single Crystal, Japanese Journal of Applied Physics, vol. 26, No. 4, Apr., 1987.*

Jergel et al., "a Critical Currents Antsotropy of $Nb_3Ge$ Superconducting Tape Prepared by CVD", Circa 1980, pp. 192–1016, 505/813.*

J. W. Heaton and Rose–Innes, "Cryogenics", vol. 4, pp. 85–89 (Apr. 1964).

C. S. Tedmon et al., "Journal of Applied Physics", vol. 36, pp. 829–835 (Mar. 1964).

Saint–James et al., "Type II Superconductivity", (Pergamon Press, 1969) pp. 248–271).

(List continued on next page.)

*Primary Examiner*—Kamand Cuneo
(74) *Attorney, Agent, or Firm*—Jackson E. Stanland; Daniel P. Morris; Ronald L. Drumheller

(57) ABSTRACT

Improved conductors and superconducting magnets are described utilizing superconducting materials exhibiting critical field anisotropy. This anisotropy is one in which the ability of the superconductor to stay in a superconducting state depends on the orientation of a magnetic field applied to the superconductor with respect to the direction of current flow in the superconductor. This anisotropy is utilized in the design of conductors and magnet windings comprising the superconductive material and specifically is directed to magnet windings in which the direction of high critical current through the superconductor is parallel to the magnetic field produced by current in these windings in order to obtain high critical fields. Particularly favorable examples of a superconducting material are the so-called high $T_c$ superconductors in which the primary supercurrent flow is confined to 2 dimensional Cu—O planes. By arranging the superconductive windings so that the Cu—O planes are substantially parallel to the magnetic field produced by current in these windings, the windings will be able to withstand high fields without being driven normal. This maximizes the magnetic field amplitudes that can be produced by the magnet.

14 Claims, 4 Drawing Sheets

PUBLICATIONS

R. A. Klemm et al., "Physical Review B", vol. 12, pp. 877–891 (Aug. 1, 1975).

J. A. Woollam and R. B. Somoano, "Physical Review B", vol. 13, pp. 3843–3853 (May 1, 1976).

M. Kawasaka et al., "Japanese Journal of Applied Physics", vol. 26, pp. L388–L390 (Apr. 1987).

J.G. Bednorz and K.A. Muller *Z. Phys. B. —Condensed Matter*, vol. 64, pp. 189–193 (1986).

M.K. Wu et al. *Phys. Rev. Letters*, vol. 58, pp. 908–910 (Mar. 2, 1987).

R.J. Cava et al. *Phys. Rev. Letters*, vol. 58, pp. 1676–1679 (Apr. 20, 1987).

Y. Hidaka et al. *Japanese Journal of Applied Physics*, vol. 26, pp. L377–L379 (Apr. 1987).

P.M. Grant et al. *Phys. Rev. B*, vol. 35, pp. 7242–7244 (May 1, 1987).

\* cited by examiner

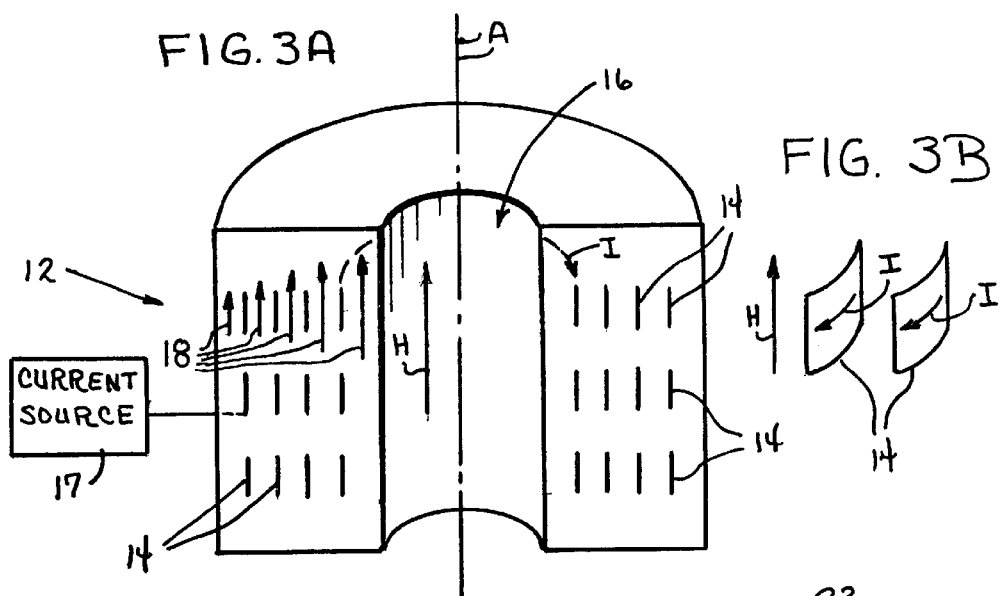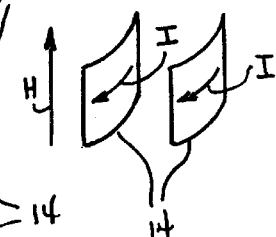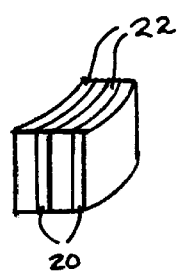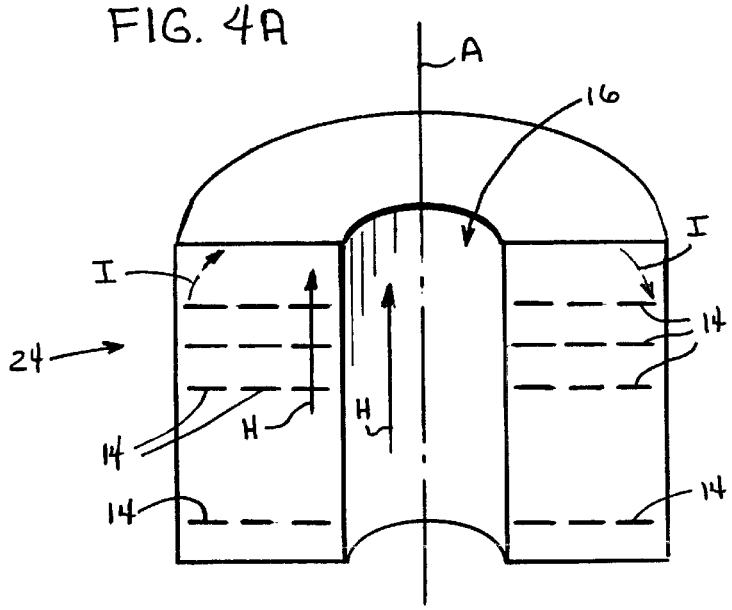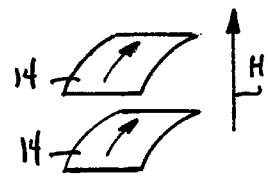

HIGH CURRENT CONDUCTORS AND HIGH FIELD MAGNETS USING ANISOTROPIC SUPERCONDUCTORS

This is a continuation of application Ser. No. 08/193,925, filed Feb. 9, 1994, which was a continuation of application Ser. No. 07/569,501, filed Aug. 20, 1990, which was a continuation of application Ser. No. 07/051,552, filed May 18, 1987.

GOVERNMENT INTEREST

This invention was made with Government support under contract N00014-85-C-0361 awarded by the Department of the Navy. The Government has certain rights in the invention.

BACKGROUND OF THE INVENTION

1. Field of the Invention

This invention relates to conductors and magnets for producing large magnetic fields, and more particularly to such magnets employing anisotropic superconductors where the field anisotropies in such superconductors are utilized to provide improved designs.

2. Description of Related Art

Superconductors of many types are known in the prior art, including both elemental metals and compounds of various types, such as oxides. The recent technical breakthrough reported by Bednorz and Mueller in Z. Phys. B, 64, 189 (1986) was the first major improvement in a superconducting material in the last decade. The materials of Bednorz and Mueller exhibited critical transition temperatures $T_c$ that were substantially above the critical transition temperatures of materials previously known. In particular, Bednorz and Mueller described copper oxide materials including a rare earth element, or rare earth-like element, where the rare earth element could be substituted for by an alkaline earth element such as Ca, Ba, or Sr.

The work of Bednorz and Mueller has led to intensive investigation in many laboratories in order to develop materials having still higher $T_c$. For the most part, these high $T_c$ oxide superconductors consist of compounds of La, Sr, Cu, and O, or compounds of Y, Ba, Cu, and O. A highlight of this activity was the attainment of superconductivity at temperatures of about 95° K as reported ported by M. K. Wu et al and C. W. Chu et al, Phys. Rev. Lett. 58, 908 (1987). Later, $Y_1Ba_2Cu_3O_{7-x}$ was isolated as the superconducting phase of these Y—Ba—Cu—O mixed phase compositions, as reported by P. M. Grant et al, Phys. Rev. B, and R. J. Cava et al, Phys. Rev. Lett. 58, 1676 (1987). These materials have a layered perovskite structure comprising two dimensional CuO layers which are believed necessary for the attainment of high transition temperatures. Hidaka et al, Japanese J. Appl. Phys. 26, L377 (1987) reported upper critical field anisotropies of 5 in single crystals of $La_{2-x}Ba_xCuO_4$.

These superconducting materials are generally termed high $T_c$ superconductors, and are materials having superconducting transition temperatures greater than 26° K. This class of superconductors includes Cu—O planes separated by rare earth or rare earth-like elements and alkaline earth elements. The crystalline structure of these materials is now well characterized as reported in the above-cited technical papers.

High $T_c$ superconductors of many forms have been prepared by a variety of techniques, including standard ceramic processing of oxide, carbonate, nitrate, powders, etc. to form of bulk materials, vapor transport for depositing thin films, and plasma spray coating. A copending application of P. Chaudhari et al, Ser. No. 027,584, filed Mar. 18, 1987 and assigned to the present assignee, describes a technique for producing thin films of these high $T_c$ superconductors. Another copending application to J. Cuomo et al, Ser. No. 043,523, filed Apr. 28, 1987 and assigned to the present assignee now abandoned in favor of a continuing application Ser. No. 276,085 filed Nov. 23, 1988); describes a plasma spray coating technique for depositing these high $T_c$ superconductors. More recently, epitaxial single crystal films have been reported by P. Chaudhari et al in a paper submitted to Phys. Rev. Lett.

Thus, significant technical achievements have been made in the science of superconducting materials in order to provide materials which exhibit critical transition temperatures above liquid nitrogen temperature (77° K). However, applications of these materials, being obviously desireable, have not yet been possible. As will be seen, the invention herein is an application of these materials to the design of improved superconducting magnets, and is based on a discovery of the present applications that these high $T_c$ superconductors can exhibit a significant critical magnetic field anisotropy and high critical currents.

Superconducting magnets are known in the art, and are conventionally used when large magnetic fields are to be produced. In fact, a great deal of speculation has occurred about the use of high $T_c$ materials for high field magnets for such diverse applications as nuclear fusion, nuclear magnetic resonance (NMR) imaging, and vehicle propulsion systems. Generally, in order to manufacture a useful magnet, the superconductor must satisfy two criteria: (1) it must have a high upper critical field $H_{c2}$ so that the superconductor does not lose its zero resistance due to the field produced in the windings by the current through other windings, and (2) it must have a high critical current so that the magnetic field it creates is large. With traditional superconducting materials (i.e., non high $T_c$ materials) the upper critical field is a composition-dependent property. However, high critical current in the presence of large magnetic fields is very dependent on the exact preparation techniques used to manufacture the material. Thus, high critical field and high critical current are not necessarily related to one another. Further, the initial studies on the new high $T_c$ materials indicated that they exhibited a very high critical field but very low critical current. Thus, while the desireability of using these materials in magnets was apparent, it was not apparent that they could be successfully employed to make a good superconducting magnet. Still further, how one would implement them to make such a magnet was also not clear.

In their experimentation, applicants have discovered that these high $T_c$ materials exhibit a very large critical field anisotropy and also exhibit a large critical current density along preferred directions. The nature of this anisotropy is that these materials can support large currents only in certain crystallographic planes. By proper design of the magnet windings, the current can be made to flow in the directions of large critical current, yet the field from the windings lies in directions of high critical field. This design will satisfy the two criteria previously described. Prior to the discovery of this large field anisotropy and the possibility of large critical currents, the design of an improved magnet was not possible. This was so even though small upper critical field anisotropies had been observed in some of these high $T_c$ materials, as noted in the aforementioned Hidaka et al reference.

Accordingly, it is a primary object of the present invention to provide an improved design for a superconducting magnet.

It is an object of this invention to provide an improved design for a superconductor and for a superconducting magnet using high $T_c$ superconductors for the magnet windings.

It is yet another object of this invention to provide an improved superconducting magnet, utilizing superconductors exhibiting significant critical field anisotropies, the design providing fields in the direction of high critical fields in the magnet windings.

It is yet another object of this invention to provide an improved superconducting magnet, utilizing superconductors exhibiting significant critical field anisotropies, and critical current anisotropies, the design providing fields in the direction of high critical fields with critical field anisotropy in the direction of high critical current.

It is another object of the present invention to provide improved superconducting toroids and solenoid-type magnets wherein the windings of these magnets are comprised of high $T_c$ superconductors.

It is another object of this invention to provide an improved superconducting magnet comprised of high $T_c$ superconductor materials as the windings of this magnet, where the windings are arranged with respect to the crystallographic current-carrying planes in these materials to provide high critical field and high critical current in the windings.

SUMMARY OF THE INVENTION

Superconducting magnets are described in which the windings are comprised of superconducting materials exhibiting critical field anisotropy, i.e., materials in which the critical field $H_{c2}$ is larger in one direction than in another direction. A large magnetic field anisotropy has been discovered in the high $T_c$ superconductors, and it has also been found that these materials are capable of carrying high critical currents. In the practice of this invention, these factors are utilized to provide a design in which the current flows in the directions of high critical current and produces fields in the direction of high critical field. More specifically, the magnet windings are arranged so that the current direction through the windings is substantially parallel to the direction having the largest critical magnetic field. In particular, the current-carrying planes in these high $T_c$ superconducting materials are arranged to be parallel to the direction in which the critical magnetic field $H_{c2}$ is largest so that the magnetic field H produced by supercurrents in the windings will be in a direction substantially parallel to the direction of maximum $H_{c2}$, if the windings are arranged as described in this invention.

The improved conductors and magnet windings can be comprised of a plurality of single crystals oriented in the same direction. Thin epitaxial films formed on flexible substrates are a particularly preferred embodiment to provide the magnet windings. Highly textured films, textured polycrystalline ceramics, etc. can also be utilized. A representative material for a superconductor winding in accordance with the present invention is a film or crystals of $Y_1Ba_2Cu_3O_{7-x}$, in which very large magnetic field anisotropies and high critical currents have recently been discovered.

These and other objects, features, and advantages will be apparent from the following more particular description of the preferred embodiments.

BRIEF DESCRIPTION OF THE DRAWINGS

In FIG. 2A, the critical field $H_{c2}$ is small in a direction perpendicular to the current-carrying planes, while in FIG. 2B the critical field $H_{c2}$ is significantly larger in a direction parallel to the current-carrying crystallographic planes. This anisotropy difference is at least an order of magnitude in some materials.

FIG. 3A illustrates the design of a superconducting solenoid in accordance with the principles of the present invention, wherein the current-carrying planes are substantially parallel to the magnetic field produced by the magnet, thereby providing a superior high field magnet.

FIG. 3B more clearly shows the orientation of the superconducting current-carrying planes with respect to the axis of the solenoid and the magnetic field H produced by current I in the solenoid windings.

FIG. 3C schematically illustrates a portion of the solenoid of FIG. 3A, and more specifically shows a plurality of superconducting layers 20, separated by support material 22, which could be stainless steel or other structural material.

FIG. 4A schematically illustrates an inferior, alternative design for a superconducting solenoid, which does not take into account the discoveries of the present invention. This design is characterized by a very low critical magnetic field which leads to poor performance of the magnet.

FIG. 4B shows a portion of the windings of the solenoids of FIG. 4A, and more particularly illustrates the orientation of the current-carrying planes with respect to the solenoid axis, and the magnetic field H produced by the solenoid.

FIGS. 6B and 6C show portions of the interior of the toroid.

DESCRIPTION OF THE PREFERRED EMBODIMENTS

As noted, this invention is directed to improved conductors and superconducting magnets having windings comprised of superconducting material exhibiting a critical magnetic field anisotropy, where the design of the windings is such that the critical current through the windings is maximum, thereby allowing the production of large magnetic fields. This type of anisotropy is present in high $T_c$ superconductors such as the Y—Ba—Cu—O systems described in the references hereinabove.

Figure 1:
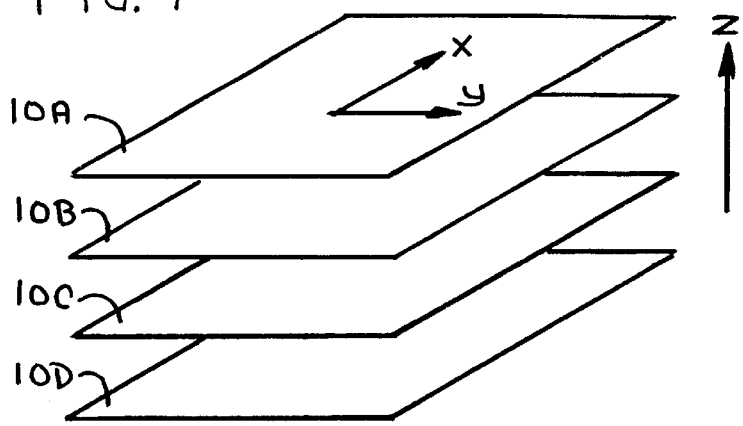
FIG. 1 schematically illustrates the directions large super currents can flow in designated crystallographic planes of a high $T_c$ superconductor.
Figure 2A:
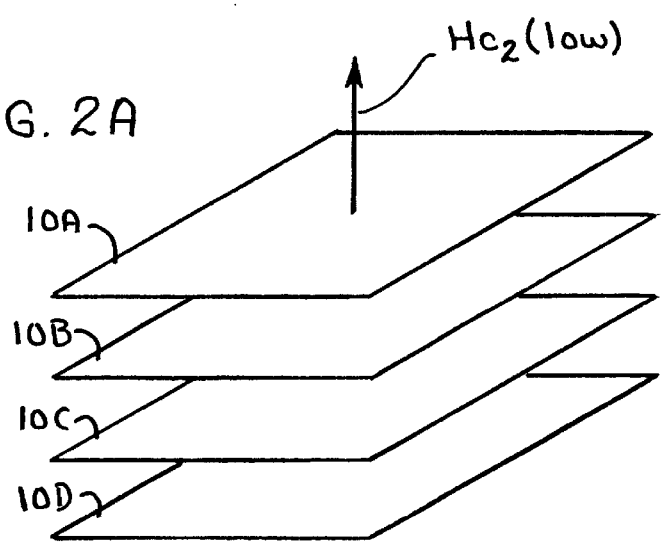
FIGS. 2A and 2B illustrate the field anisotropy effect for these high $T_c$ superconductors.
Figure 2B:
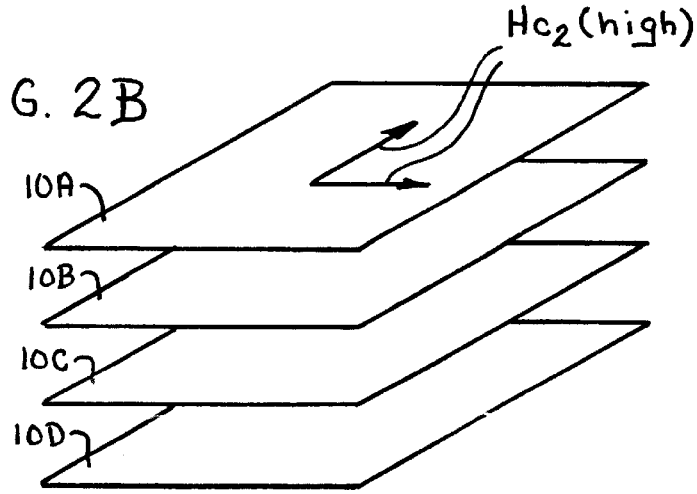

The field anisotropy effect is illustrated more particularly with respect to FIGS. 1, 2A, and 2B. A representative high $T_c$ material is $Y_1Ba_2Cu_3O_{7-x}$. A single crystal of this material can be prepared by techniques similar to those used by Iwazumi et al, Jap. J. Appl. Phys. 26, L386 (1987). A sintered powder containing three phases $Y_1Ba_2Cu_3O_{7-x}$, CuO, and $BaCuO_2$ and having a nominal composition of $Y_{0.25}Ba_{0.61}CuO_{2.62}$ is formed in a pellet and fired in a slightly reducing atmosphere at 975° C. for 12 hours. During the 975° C. soak, an oxidizing atmosphere is introduced to promote growth of the $Y_1Ba_2Cu_3O_{7-x}$ crystallites already present in the particle compact. This technique routinely produces highly faceted crystals of high quality.

As grown, these crystals typically display superconducting diamagnetic transitions in the 40–50 K region. Annealing in flowing oxygen for extended periods at 450–500° C. raises the transition temperatures to about 85° K.

As is known for these materials, Cu—O planes exist which are parallel to one another and comprise the supercurrent carrying planes of the material. This is illustrated in FIG. 1, where four such superconducting planes 10A, 10B, 10C, and 10D are illustrated. These Cu—O basal planes are planes substantially perpendicular to the c-axis of the crystal that are separated by about 4 angstroms and are capable of carrying large critical currents in the x-y directions in the Cu—O planes. Supercurrent conduction in the z direction perpendicular to these planes is minimal.

FIGS. 2A and 2B illustrate the large critical field anisotropy discovered in these materials. In FIG. 2A the critical magnetic field $H_{c2}$ is in a direction substantially perpendicular to the current carrying planes 10A–10D. In this case, the critical transition field $H_{c2}$ in which the superconductor loses its zero resistance state is relatively low.

In contrast with the situation depicted in FIG. 2A, the magnetic field orientation in FIG. 2B is parallel to the Cu—O current-carrying planes 10A–10D. This field can be in either the x or y direction, and the critical field $H_{c2}$ is very large, and can be an order of magnitude higher critical field than the critical field which results when the field is oriented perpendicular to the current-carrying planes.

It has also been discovered that the high $T_c$ superconductor $Y_1Ba_2Cu_3O_{7-x}$ can carry large supercurrent densities (approximately $3 \times 10^6$ A/cm$^2$) in favorable directions at 4.5° K, and that large supercurrent carrying capability can exist in moderate fields, as indicated in FIG. 2B. These factors are utilized in the design of improved superconducting magnets, as will be illustrated in FIG. 3A–6B. It is anticipated that with improved processing these high critical currents will persist to higher temperatures as has been demonstrated for films of these materials.

The superconducting magnets of this invention have windings which are constructed such that the magnetic field produced by current in the windings is parallel to the crystallographic planes which carry the supercurrents in these materials. If this design is followed, the field produced by the windings will not easily destroy the superconductivity, so that large magnetic fields can be generated. An example of this design is illustrated by the solenoid of FIG. 3A, a portion of which is shown. It will be understood by those of skill in the art that the remaining portion of the solenoid completes the current carrying path and is generally circular about the axis A. FIG. 3B provides more details of the windings and in particular the orientation of the current-carrying planes in the superconductors comprising the windings. FIG. 3C is a sectional view of a portion of the windings, illustrating their fabrication as oriented layers.

In more detail, solenoid 12 is comprised of a plurality of windings 14, illustrated by the vertical lines which are representative of the current-carrying planes in a high $T_c$ superconductor material. The magnetic field H produced by current I in the superconductive windings is parallel to the axis A of the solenoid and is more heavily concentrated in the hollow core 16 of the solenoid. Electrical current is provided by one or more current sources 17, as is well known in the art. In operation, the magnet would be immersed in liquid He or N, or these liquids would be passed through tubes in the structure in a manner well known in the art. When the solenoid is providing a constant field, only very little heat is produced. It is only when the field H is changed, that a greater amount of heat will be produced. The superconducting windings can also be clad with copper, or some other thermally and/or electrically conductive material such as Ag, as is well known in the art. High currents would flow into the copper cladding when the field is changed, then would flow back into the superconductors when cooling is achieved.

The vertical lines 14 in FIG. 3A represent the current carrying planes of the superconductor comprising the magnet windings. These windings are used to provide circumferential currents in order to produce the axial magnetic field H. This field is most intense along the hollow core 16 of the solenoid, and diminishes in a radial dial direction, as indicated by the arrows 18 of diminishing length measured in a radial direction from the axis A.

FIG. 3B shows only two of the many Cu—O supercurrent conducting planes 14 which can be present in a single layer or crystal of high $T_c$ superconductor, or in adjacent layers of such crystals. As is well known, the Cu—O planes in these materials are separated from one another by approximately 4 angstroms. As is apparent from FIG. 3B, these Cu—O planes 14 are arranged substantially parallel to one another and circumferentially about the axis A of the solenoid. Supercurrents I flow in the planes 14 in a circumferential manner around the solenoid. These supercurrents produce a magnetic field H which is parallel to the current carrying planes and therefore the critical magnetic field is not exceeded until the larger $H_{c2}$ is reached. Since the amount of critical current that can exist in the Cu—O planes can be high, this allows the production of high magnetic fields without a loss of superconductivity in the planes 14.

FIG. 3C schematically illustrates a plurality of superconducting material layers 20, separated by support material 22, which could be stainless steel or another material. The support materials are flexible and can be formed to provide the windings of the magnet, where the superconducting materials 20 are deposited as epitaxial thin film layers. As an alternative, the superconductive layers 20 can be polycrystalline films where the crystallites are substantially aligned to provide the Cu—O superconducting planes in a direction substantially parallel to the field H. These fabrication techniques will be described in more detail later.

FIG. 4A illustrates another solenoid, except that the design of the superconductive windings in this solenoid is such that the critical magnetic field will be quite low, and at least an order of magnitude less than that obtained with the geometry of FIG. 3A. In order to contrast the designs of FIG. 3A and FIG. 4A, the same reference numerals will be used to indicate the same or functionally similar components. Accordingly, solenoid 24 of FIG. 4A is comprised of a plurality of current-carrying planes 14 which are arranged circumferentially around the hollow center portion 16 of the solenoid. The magnetic field H produced by current in the Cu—O planes is designated by the arrows H. The strength of field H is maximum in the center portion 16 of the solenoid 24, and is directed along the axis of the solenoid.

The arrangement of the current-carrying Cu—O planes 14 in the windings of the solenoid of FIG. 4A is shown in more detail in FIG. 4B. These Cu—O current-carrying planes are disposed horizontally so that the magnetic field H is in a direction substantially perpendicular to the current-carrying planes. Referring to FIG. 2A, this orientation of the current-carrying planes and the magnetic field H leads to a situation where the magnetic field produced by the windings is in the direction of the lower $H_{c2}$. This means that the solenoid 24 of FIG. 4A cannot be used to produce magnetic fields as large as those that can be produced by the solenoid 12 of FIG. 3A.

In the design of FIG. 3A, the field produced by current in the windings is in a direction that is parallel to the current-carrying planes, while in the design of FIG. 4A the field is in a direction substantially perpendicular to the current-carrying planes. While these structures show the extremes of the design considerations, it will be appreciated by those of skill in the art that, to the extent the field is substantially parallel to the current-carrying planes, an improvement in the amount of magnetic field that can be produced by the solenoid will be achieved. Thus, even designs where the magnetic field makes an angle with the current-carrying planes will provide some enhancement of the strength of the magnetic field that can be produced. Since the easy direction for the current is along the Cu—O planes, it is believed that some misalignment of the field H and the Cu—O planes can be tolerated, as can a misalignment of the Cu—O planes themselves.

Figure 5A:
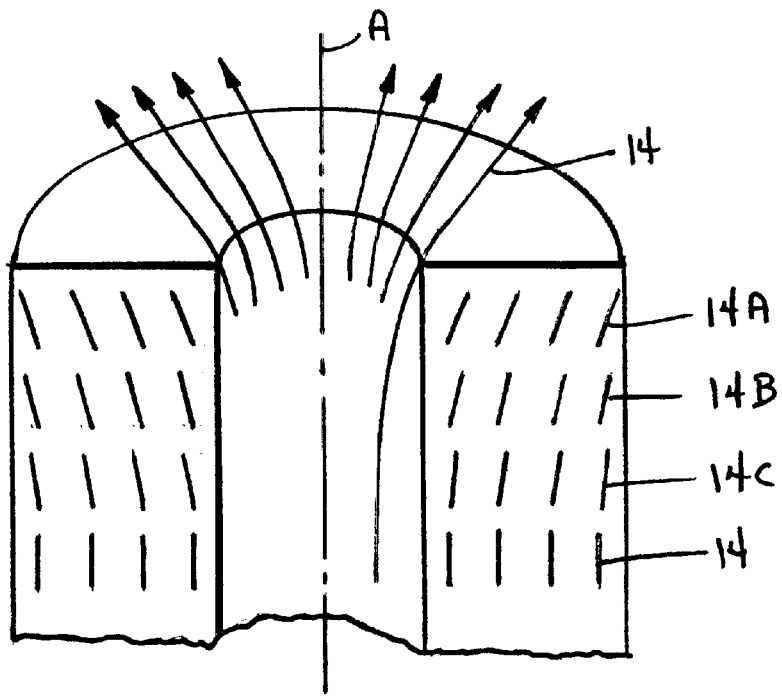
FIG. 5A illustrates a refinement of the solenoid design of FIG. 3A which compensates for the fringing of the magnetic field H at the ends of the solenoid, the crystallographic current-carrying planes being inclined at the ends of the solenoid to be substantially parallel to the fringing field.

FIG. 5A illustrates a refinement of the solenoid design of FIG. 3A which compensates for the fringing of the magnetic field H at the ends of the solenoid. In order to relate FIG. 5 to FIGS. 3A and 3B, the same reference numerals will be used. Therefore, the superconducting current-carrying planes 14 are arranged in a direction substantial parallel to the magnetic field H in the center of the solenoid. This is a direction parallel to the axis A of the solenoid. As was noted with respect to FIG. 3B, the current-carrying planes 14 circumferentially wrap around the solenoid, being generally parallel to the axis A. However, in order to have these current-carrying planes be substantially parallel to the magnetic field H at the end of the solenoid where the field H is distorted from a direction perfectly parallel to the axis A, the superconducting material comprising the windings of the solenoid is oriented such that the Cu—O current-carrying planes are tilted outwardly at the ends of the solenoid, as is schematically illustrated with respect to the planes in rows 14A, 14B, and 14C. This is easily accomplished by using conventional techniques wherein windings are stacked to make a solenoid, the substrates on which the superconducting layers are formed having a tapered width in the regions near the end of the solenoid. This is illustrated in FIG. 5B, where the substrates 32 have varying width so that the superconducting layers 34 are tilted somewhat from an axial direction.

Figure 5B:
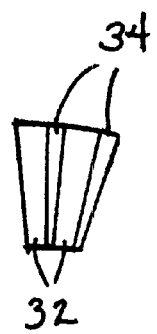
FIG. 5B illustrates a layered structure which will tilt the crystallographic current-carrying planes at the ends of the solenoid.

As an alternative to the design of FIGS. 5A, 5B, the windings toward the ends of the solenoid can be comprised of copper or another material which has a high current-carrying capability.

A particular magnet design that is of significant advantage, as for instance in the generation of fusion power, is a toroid. A toroid is a magnet that is particularly well suited for design in accordance with the principles of the present invention, as will be illustrated in FIGS. 6A, 6B, and 6C. The toroid 26 is a generally donut-shaped magnet having an open inner portion 28 and an annular, generally circular cross-sectional opening 30 (FIGS. 6B, 6C) which extends around the circumference of the toroid. The field H produced by current I in the toroid is a circumferential field which is maximum in the annular hollow portion 30. The currents I are provided by current source 31 and flow through windings wrapped around the toroid ring in planes substantially normal to the axis of the hollow annular portion 30. Toroid 26 can also be cooled by liquid He or liquid N in known ways.

Figure 6A:
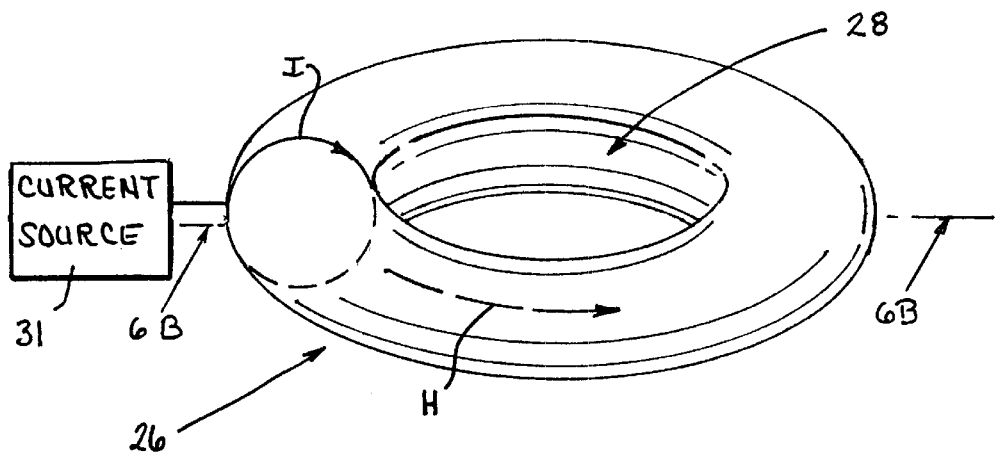
FIGS. 6A–6C illustrate a magnetic toroid made in accordance with the present invention, where FIG. 6A schematically shows the toroid
Figure 6B:
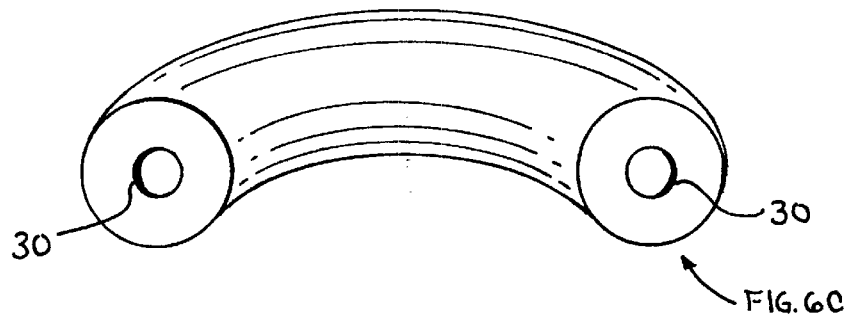

FIG. 6B is a cross-sectional view of the toroid 26 taken along line 6B—6B, and shows a portion of the toroid 26 of FIG. 6A, to further illustrate its geometry. In particular, the annular opening 30 in which the maximum magnetic field H is produced by the currents I, is shown.

Figure 6C:
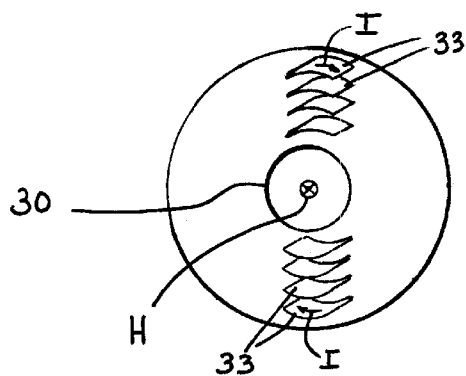

FIG. 6C is an end view of the toroid of FIG. 6B and illustrates the arrangement of the Cu—O planes in the superconducting material which allows maximum currents to flow through the windings in order to maximize the magnetic field produced by the toroid 26. The superconductive material comprising the magnet windings is deposited in such a manner that the Cu-O current-carrying planes 33 are oriented to provide windings whose axis is concentric to the axis of the annular opening 30. That is, the Cu—O planes are disposed concentrically and parallel to the circumferential field H in the hollow annulus 30.

While a particular example ($Y_1Ba_2Cu_3O_{7-x}$) of a high $T_c$ conductor has been described as an example of a material exhibiting a large magnetic field anisotropy, the superconductors that can be used for the magnet windings of this invention can be fabricated from any superconductors exhibiting this critical field anisotropy. It is known, for instance, that a large number of rare earth ions can be substituted for Y in $Y_1Ba_2Cu_3O_{7-y}$, and the composition will still maintain a high $T_c$ and also the anisotropy properties of the $Y_1Ba_2Cu_3O_{7-y}$ material. However, in order to make a high field superconducting magnet, it is preferrable to have the critical field anisotrophy exhibit a high value, such as 10 or more, in order to maximize the magnitudes of the fields that can be produced. Further, materials exhibiting high critical currents are preferrable as these materials will be able to provide larger magnetic fields.

In particular, the invention can use high $T_c$ superconductors which can be fabricated to orient the Cu—O current-carrying planes to take advantage of the large critical field anisotropy. Fabrication of the superconducting windings can utilize single crystals, epitaxial films, highly textured films in which the Cu—O planes are generally aligned, textured polycrystalline ceramics having generally ordered crystallographic Cu—O planes, or any other technique that induces the Cu—O planes to orient parallel to one another. For example, magnetic fields are commonly used to align magnetic domain patterns in magnetic films. Accordingly, yttrium or another rare earth element can be totally or partially replaced with a magnetic element such as gadolinium or holmium without detracting from the superconducting properties of the material. Since Gd and Ho have strong magnetic properties, these properties can be exploited to encourage the alignment of the magnetic ions and, therefore, indirectly align the Cu—O planes in a film of this superconducting material. Further, since the radius of the superconducting windings is very large in comparison with the crystallite size in these materials, the amount of bending, and therefore strain on the crystals, will be very small and the alignments can be accomplished. For example, the orientation of the Cu—O planes can be accomplished as large "green" sheets of superconducting material are being deposited. Alternatively, preferred orientation may be promoted by pressure-assisted densification. This alignment of the crystallographic current-carrying planes can also occur during the annealing process or during deposition of the films. However, even if the Cu—O planes are somewhat tilted with respect to one another, enhancement of magnet design will occur since the principles of the present invention will still be exploited (although to a lesser extent). That is, the general direction of current flow in the superconductive windings will produce a field substantially in the direction of higher $H_{c2}$.

While it is believed that current flow in these high $T_c$ materials is most likely along 2 dimensional planes, it may be that there is some supercurrent conduction along one dimensional Cu—O chains, and that these 1-dimensional chains play a role in the anisotropic superconductivity. Orientation of the planes such that the chains are along the direction of high supercurrent flow may further enhance the critical suppercurrent.

While high $T_c$ superconducting materials such as Y—Ba—Cu—O and variations thereof are particularly suitable materials in the practice of this invention, it should be understood that layered composite superconductors can be fabricated to exhibit a critical field anisotropy that could be exploited using the principles of the present invention. For example, a layered superlattice structure comprising a superconductive layer—normal metal layer—superconductive layer . . . can be fabricated with sufficient orientation of the crystallographic planes to provide aligned pathways for current flow in a direction parallel to the magnetic field produced by the current flow in order to maximize the amount of magnetic field that can be produced. Further, it is known in the design of superconducting magnets that the magnetic field strength is maximum in the center of the magnet and decreases in an outwardly radial direction. In these magnets, the inner windings are often chosen to be nonsuperconducting materials which can withstand the high magnetic fields in the interior of the magnet, while the outer windings are the superconductive windings. Also, conventional magnets are made by fabricating sections and stacking the sections together to create the large magnet. These approaches can be used with the magnets of the present invention in order to facilitate fabrication and to achieve very high magnetic fields.

While the invention has been described with respect to particular embodiments thereof, it will appreciated by those of skill in the art that variations can be made therein without departing from the spirit and scope of the present invention. For example, different types of superconductive material can be utilized in addition to those specifically referenced. The important features are that the windings of the magnet are fabricated so that the magnetic field produced by current flow in the windings is in the direction of high critical field in order to maximize the amount of field that can be produced by the magnet. Another important feature is that the crystallite planes are oriented along the direction that carries a large current. This in turn is used to make an improved supercurrent conductor, as will be explained later.

In the further practice of this invention, it should be noted that these magnets can be operated over a very wide temperature range, including temperatures down to liquid helium temperatures. For example, critical currents at 4.5° K in the range of about $3 \times 10^6$ A/cm$^2$ have been measured in the direction of Cu—O planes in crystals of $Y_1Ba_2Cu_3O_{7-x}$. Combining the proper geometry utilizing the critical field anisotropy in these materials with operation at 4.5° K, where the critical currents are largest, will provide a magnet capable of producing extremely, high magnetic fields.

In another aspect of this invention, the use of mixed copper oxide materials of the types in the art known as high $T_c$ superconductors provides magnets having unique properties of anisotropy and critical current, resulting in specialized magnets having superior properties.

As was noted previously, the crystallite planes of these high $T_c$ superconductors can be oriented along the direction that carries a large current. Thus, if the crystal grains of these materials are aligned to provide this, a conductor can be fabricated which will have the capability of carrying a large current. This conductor can be fabricated as a wire, tape, flat lead, etc. and, if the current-carrying planes are substantially parallel, the amount of current that is carried can be more than 30 times that which can be carried without this orientation.

Having thus described our invention what we claim as new and desire to secure as Letters Patent, is:

1. An improved superconductive structure which carries a higher maximum density of supercurrent without transitioning out of a superconducting state, comprising:

a high $T_c$ superconductive copper oxide film for carrying supercurrent within said film in a direction substantially parallel to a major surface thereof, said film having a crystallographic structure with parallel Cu—O crystallographic planes extending therein sufficient to create a critical supercurrent anisotropy in said film, said critical supercurrent anisotropy allowing much more supercurrent to flow along said parallel Cu—O crystallographic planes than in a direction perpendicular thereto without causing a transition of said film out of said superconducting state, said film being formed so as to orient said Cu—O crystallographic planes substantially parallel to said major surface; and means for flowing supercurrent through said film in a direction substantially parallel to said major surface, whereby the maximum density of supercurrent flowing through said superconducting film in a superconductive state is increased.

2. A superconductive structure as in claim 1 wherein said film is on a supporting substrate.

3. A superconductive structure as in claim 1 wherein said film also exhibits an upper critical magnetic field $H_{c2}$ anisotropy, said upper critical magnetic field anisotropy allowing a much higher magnetic field to be created along said parallel Cu—O crystallographic planes than in a direction perpendicular thereto without causing a transition of said film out of said superconducting state, and said film having a geometry such that the magnetic field produced by the supercurrent flowing through said film is oriented substantially parallel to said Cu—O crystallographic planes.

4. A superconductive structure as in claim 3 wherein said film has a toroid geometry.

5. A superconductive structure as in claim 3 wherein said film has a solenoid geometry.

6. An improved superconductive structure which remains in a superconducting state at a higher density of supercurrent, comprising:

a conductor through which supercurrent can flow to create a magnetic field;

current means for producing supercurrent flow in said conductor, said conductor consisting essentially of a high $T_c$ superconductive copper oxide material having a crystallographic structure with parallel Cu—O crystallographic planes extending therein sufficient to create a critical supercurrent anisotropy in said conductor, said critical supercurrent anisotropy allowing much more supercurrent to flow along said parallel Cu—O crystallographic planes than in a direction perpendicular thereto without causing a transition of said conductor out of said superconducting state, said conductor being formed so as to orient each said Cu—O crystallographic plane substantially parallel to the direction of flow of said supercurrent through said each Cu—O crystallographic plane, whereby the maximum density of supercurrent flowing through said conductor in a superconductive state is increased.

7. A superconductive structure as in claim 6 wherein said conductor also exhibits an upper critical magnetic field $H_{c2}$ anisotropy, said upper critical magnetic field anisotropy allowing a much higher magnetic field to be created along said parallel Cu—O crystallographic planes than in a direction perpendicular thereto without causing a transition of said conductor out of said superconducting state, and said conductor having a geometry such that the direction of the magnetic field produced by the supercurrent flowing through said conductor is oriented at said each Cu—O crystallographic plane in a direction substantially parallel to said each Cu—O crystallographic plane.

8. A superconductive structure as in claim 7 wherein said direction of flow of said supercurrent through said each Cu—O crystallographic plane and said direction of the magnetic field at said each Cu—O crystallographic plane are substantially perpendicular to each other.

9. A superconductive structure as in claim 8 wherein said conductor has a toroid geometry.

10. A superconductive structure as in claim 8 wherein said conductor has a solenoid geometry.

11. A superconductive structure which carries a higher maximum density of supercurrent without transitioning out of a superconducting state, comprising:

a plurality of windings through which supercurrents can flow to create a magnetic field;

current means for causing supercurrents to flow in said windings, said windings comprising a high $T_c$ superconductive copper oxide material having a crystallographic structure with parallel Cu—O crystallographic planes extending therein sufficient to create both a critical supercurrent anisotropy and an upper critical magnetic field $H_{c2}$ anisotropy in said windings, said critical supercurrent anisotropy allowing much more supercurrent to flow along said parallel Cu—O crystallographic planes than in a direction perpendicular thereto without causing a transition of said conductor out of said superconducting state, said upper critical magnetic field anisotropy allowing a much higher magnetic field to be created along said parallel Cu—O crystallographic planes than in a direction perpendicular thereto without causing a transition of said conductor out of said superconducting state, said windings being formed so as to orient each of said Cu—O crystallographic planes substantially parallel to the direction of supercurrent flow in said each Cu—O crystallographic plane and also simultaneously substantially parallel to the direction of the magnetic field at said each Cu—O crystallographic plane produced by said supercurrents in said windings, whereby the maximum density of supercurrent flowing through said windings in a superconductive state is increased.

12. A superconductive structure as in claim 11 wherein said direction of supercurrent flow through said each Cu—O crystallographic plane and said direction of the magnetic field at said each Cu—O crystallographic plane are substantially perpendicular to each other.

13. A superconductive structure as in claim 12 wherein said windings have a toroid geometry.

14. A superconductive structure as in claim 12 wherein said windings have a solenoid geometry.

\* \* \* \* \*